US006686784B2

United States Patent
Chang

(10) Patent No.: US 6,686,784 B2
(45) Date of Patent: Feb. 3, 2004

(54) HYBRID PHASE-LOCKED LOOP

(75) Inventor: Horng-Der Chang, HuaLien (TW)

(73) Assignee: Realtek Semiconductor Corp. (TW)

(*) Notice: Subject to any disclaimer, the term of this patent is extended or adjusted under 35 U.S.C. 154(b) by 0 days.

(21) Appl. No.: 10/321,998

(22) Filed: Dec. 17, 2002

(65) Prior Publication Data
US 2003/0117195 A1 Jun. 26, 2003

(30) Foreign Application Priority Data

Dec. 20, 2001 (TW) .......................... 90131999 A

(51) Int. Cl.[7] ................................................ H03L 7/00
(52) U.S. Cl. .......................... 327/157; 327/156; 331/25
(58) Field of Search ................................ 321/156, 157, 321/158, 159; 331/17, 25, 57, 2

(56) References Cited

U.S. PATENT DOCUMENTS 6,028,488 A * 2/2000 Landman et al. ............ 331/1 A
6,052,034 A * 4/2000 Wang et al. ................... 331/2

* cited by examiner

Primary Examiner—Dinh T. Le

(57) ABSTRACT

A hybrid phase-locked loop, comprising: a phase-frequency detector, for detecting the phase difference between a reference signal and an oscillation feedback signal and generating a digital phase-difference signal according to a mean-frequency signal; a digit pump, for receiving the phase-difference signal and generating a proportional gain signal and an accumulative gain signal according to a proportional gain value and an accumulative gain value; a digital filter, for receiving the proportional gain signal and the accumulative gain signal so as to generate a digital control signal; a digit-controlled oscillator (DCO), for receiving the control signal and the mean-frequency signal so as to generate a phase-swap signal; a phase selector, for receiving a plurality of multi-phase signals and the phase-swap signal so as to select one among neighboring phases to be the mean-frequency signal according to the phase-swap signal; an analog phase-locked loop, for receiving the mean-frequency signal and filtering out the cycle-to-cycle jitter thereof so as to generate an output signal; and a frequency divider, for receiving the output signal and dividing the frequency thereof so as to generate the oscillation feedback signal.

20 Claims, 4 Drawing Sheets

HYBRID PHASE-LOCKED LOOP

BACKGROUND OF THE INVENTION

1. Field of the Invention

The present invention generally relates to a phase-locked loop (PLL) and, more particularly, to a hybrid phase-locked loop with digital processing and analog processing mixed therein.

2. Description of the Prior Art

FIG. 1 shows a conventional analog phase-locked loop. The analog phase-locked loop 10 includes frequency dividers 11 and 12, a phase-frequency detector (PFD) 13, a charge pump 14, a loop filter 15 and a voltage-controlled oscillator (VCO) 16. The phase-locked loop 10 divides an input reference signal $F_{ref}$ and an oscillation signal $F_{VCO}$ by the same/different multiple(s) such as M or/and N by using the frequency dividers 11 and 12. Then, the phase-locked loop 10 evaluates the differences of phase and frequency between the output signals from the frequency dividers 11 and 12 by using the phase-frequency detector (PFD) 13, so as to generate difference signals. The charge pump 14 and the loop filter 15 generate a control voltage $V_C$ according to the difference signals. The voltage-controlled oscillator 16 outputs an oscillation signal $F_{VCO}$ corresponding to the control voltage $V_C$. The phase-locked loop 10 may change the frequency of the oscillation signal $F_{VCO}$ by varying the frequency-dividing multiple(s) of the frequency dividers 11 and 12.

However, there exists a dilemma situation considering the circuit design. On the one hand, concerning the jitter of the reference signal $F_{ref}$, the loop bandwidth $F_{LBW}$ of the PLL should be designed to be sufficiently narrow in order to filter out the $F_{ref}$ jitter; on the other hand, considering the jitter of the voltage-controlled oscillator 16, the loop bandwidth of the PLL should be wide enough to eliminate the $F_{VCO}$ jitter. In addition to the dilemma situation in circuit design, there is also a problem related to the stabilization of the PLL. Generally, the PLL is reliable only when the ratio of $F_{LBW}$ of the PLL to the frequency of $F_{ref}$ satisfies the following inequality (1):

$$\frac{F_{ref}}{F_{LBW}} \geq K \quad (1)$$

The inequality (1) comes into existence when the frequency of $F_{ref}$ is relatively high. However, when the frequency of $F_{ref}$ is low and the output frequency of the voltage-controlled oscillator is high, the jitter of the voltage-controlled oscillator cannot be effectively eliminated since the loop bandwidth $F_{LBW}$ of the PLL is not sufficiently large for the sake of stabilization. For example, in a liquid crystal display (LCD) controller chip, the frequency of the reference signal (i.e., the horizontal synchronous signal, HSYNC) $F_{ref}$ is in the range of 30 KHz~100 KHz and the frequency of the voltage-controlled oscillator is in the range of 25 MHz~200 MHz. The multiple is in the range of 800~2000. Therefore, the jitter of the voltage-controlled oscillator cannot be suppressed by using a conventional PLL.

SUMMARY OF THE INVENTION

In view of the aforementioned problems, it is the primary object of the present invention to provide a hybrid phase-locked loop with digital processing and analog processing mixed therein.

It is another object of the present invention to provide a hybrid phase-locked loop, in which the long-term jitter of a voltage-controlled oscillator is effectively reduced when the frequency of a reference signal is low and the jitter of the reference signal is large.

In order to achieve the foregoing objects, the present invention provides a hybrid phase-locked loop, comprising: a phase-frequency detector, for detecting the phase difference between a reference signal and an oscillation feedback signal and generating a digital phase-difference signal according to a mean-frequency signal; a digit pump, for receiving the phase-difference signal and generating a proportional gain signal and an accumulative gain signal according to a proportional gain value and an accumulative gain value; a digital filter, for receiving the proportional gain signal and the accumulative gain signal so as to generate a digital control signal; a digital-controlled oscillator (DCO), for receiving the control signal and the mean-frequency signal so as to generate a phase-swap signal; a phase selector, for receiving a plurality of multi-phase signals and the phase-swap signal so as to select one among neighboring phases to be the mean-frequency signal according to the phase-swap signal; an analog phase-locked loop, for receiving the mean-frequency signal and filtering out the cycle-to-cycle jitter thereof so as to generate an output signal; and a frequency divider, for receiving the output signal and dividing the frequency thereof so as to generate an oscillation feedback signal.

Other and further features, advantages and benefits of the invention will become apparent in the following description taken in conjunction with the following drawings. It is to be understood that the foregoing general description and following detailed description are exemplary and explanatory but are not to be restrictive of the invention. The accompanying drawings are incorporated in and constitute a part of this application and, together with the description, serve to explain the principles of the invention in general terms.

BRIEF DESCRIPTION OF THE DRAWINGS

The objects, spirits and advantages of the preferred embodiment of the present invention will be readily understood by the accompanying drawings and detailed descriptions, wherein.

DETAILED DESCRIPTION OF THE INVENTION

The present invention providing a hybrid phase-locked loop can be exemplified by the preferred embodiment and the accompanied drawings as described hereinafter. In the prior-art PLL design, there is a dilemma situation when it comes to suppression of the jitter of the reference signal as well as the jitter of the oscillation signal from the voltage-controlled oscillator. However, in the present invention, the hybrid phase-locked loop suppresses the jitter of the reference signal by using digital processing and suppresses the jitter of the voltage-controlled oscillator by using analog processing.

Figure 1:
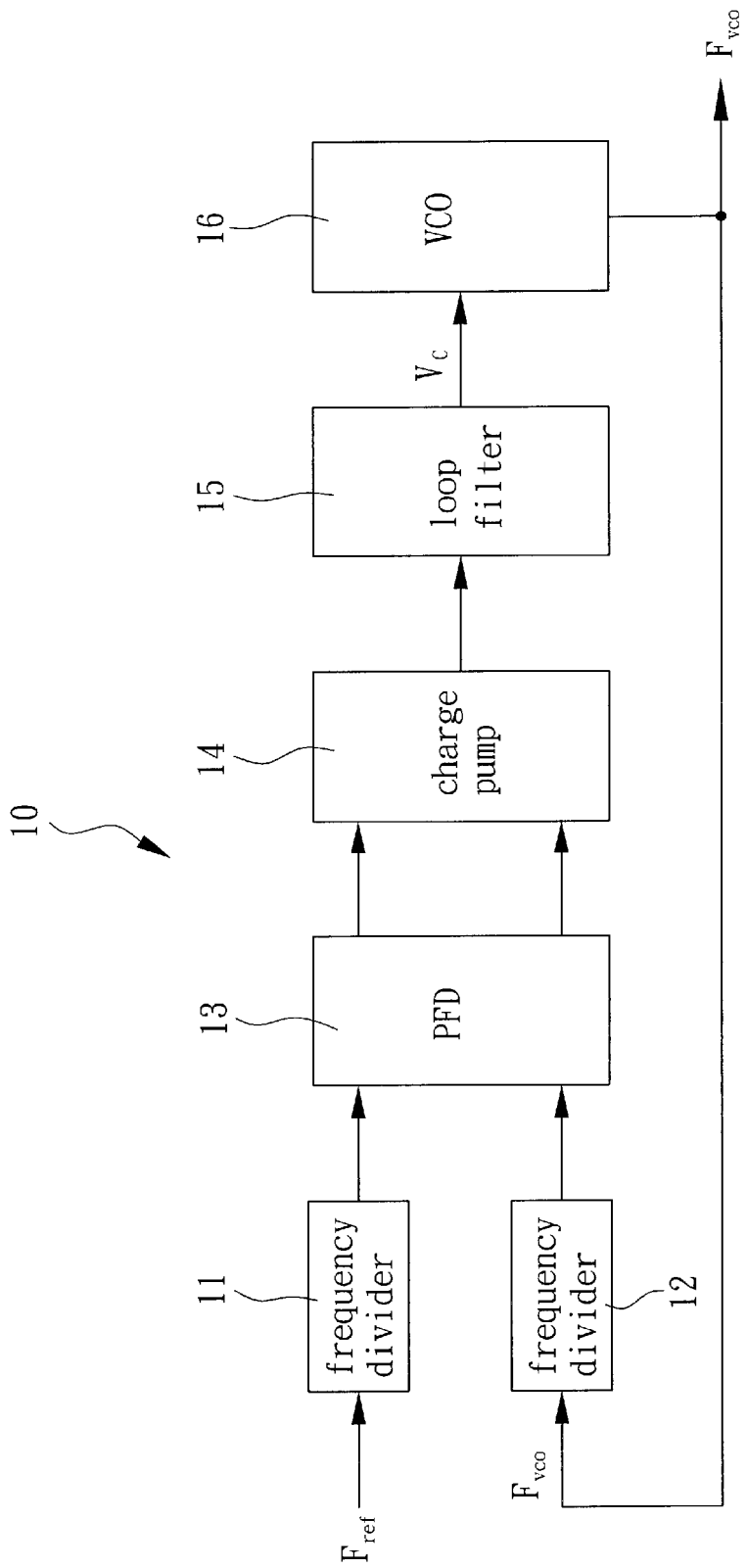
FIG. 1 is a schematic block diagram showing a conventional analog phase-locked loop.
Figure 2:
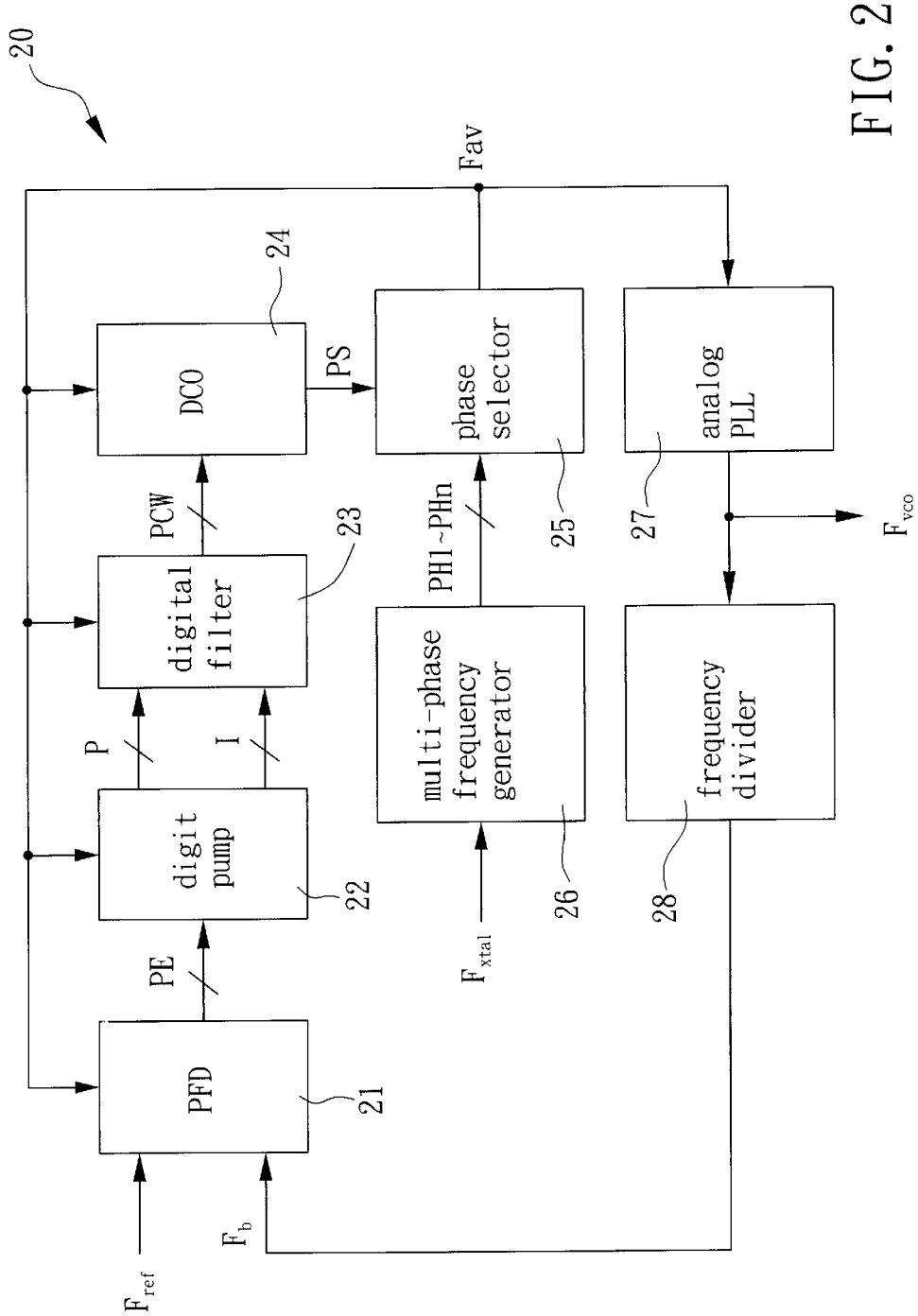
FIG. 2 is a schematic block diagram showing a hybrid phase-locked loop in accordance with the present invention.

FIG. 2 is a schematic diagram showing a hybrid phase-locked loop in accordance with the present invention. As shown in FIG. 2, the hybrid phase-locked loop 20 comprises: a phase-frequency detector 21; a digit pump 22; a digital filter 23; a digit-controlled oscillator 24; a phase selector 25; a multi-phase frequency generator 26; an analog phase-locked loop 27; and a frequency divider 28. More particularly, the phase-frequency detector 21, the digit pump 22, the digital filter 23, the digit-controlled oscillator 24, the phase selector 25 and the frequency divider 28 are included in digital processing, while the multi-phase frequency generator 26 and the analog phase-locked loop 27 are included in analog processing.

Figure 3:
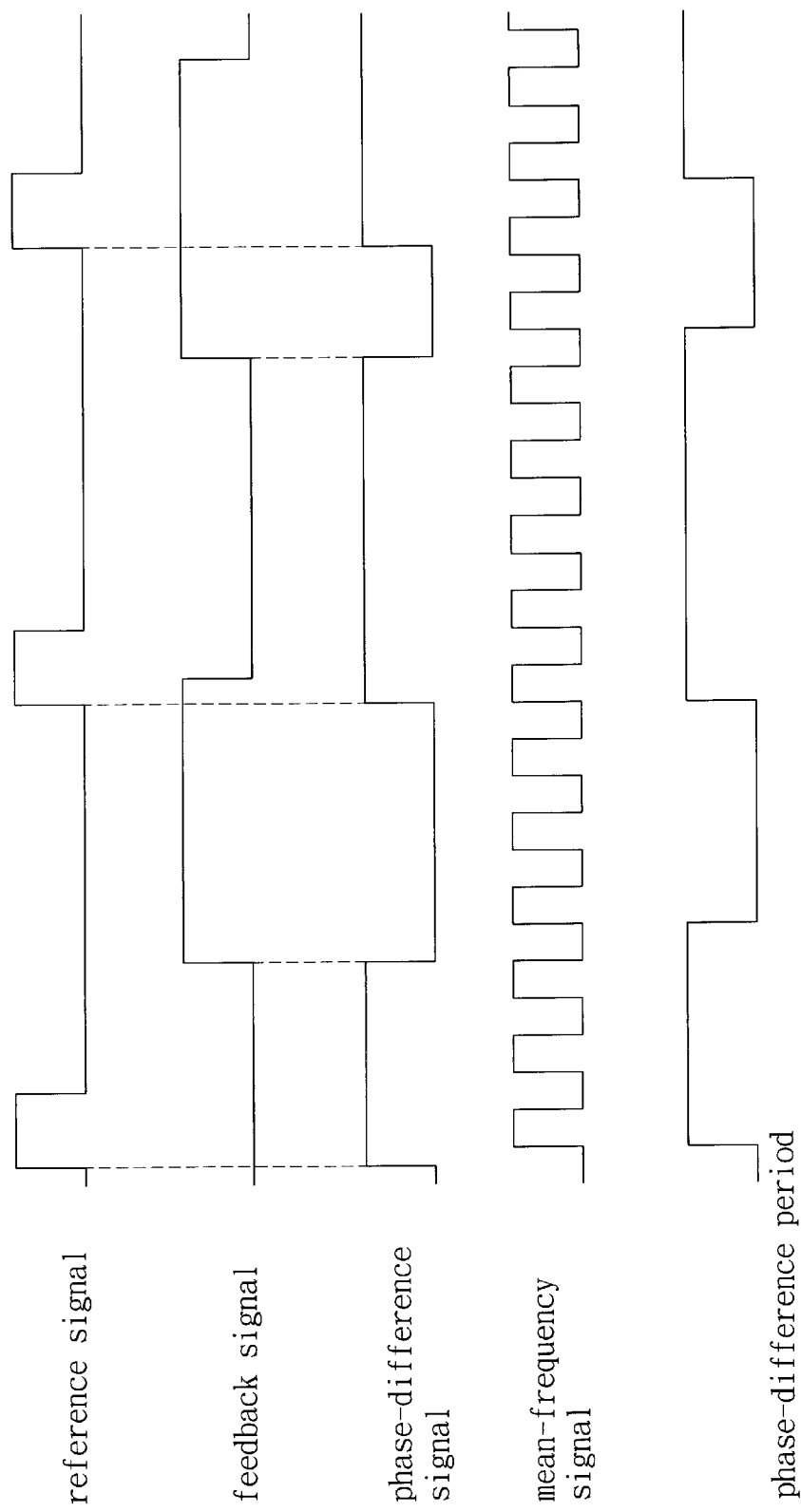
FIG. 3 is a timing diagram showing waveforms of a reference signal, an oscillation feedback signal and a phase-difference signal.

The phase-frequency detector 21 detects the phase difference between the reference signal $F_{ref}$ and the oscillation feedback signal $F_b$ and outputs a phase-difference signal PE. The phase-difference signal PE is a digit signal, indicating the number of pulses generated by the mean-frequency signal Fav during the phase-difference period between the reference signal $F_{ref}$ and the oscillation feedback signal $F_b$. The reference signal $F_{ref}$ is the horizontal synchronous signal (HSYNC) in a LCD controller chip. FIG. 3 is a timing diagram showing waveforms of a reference signal, an oscillation feedback signal and a phase-difference signal. As shown in FIG. 3, the larger the phase difference between the reference signal $F_{ref}$ and the oscillation feedback signal $F_b$ is, the longer the phase-difference period would be, resulting in a larger phase-difference signal PE.

Figure 4:
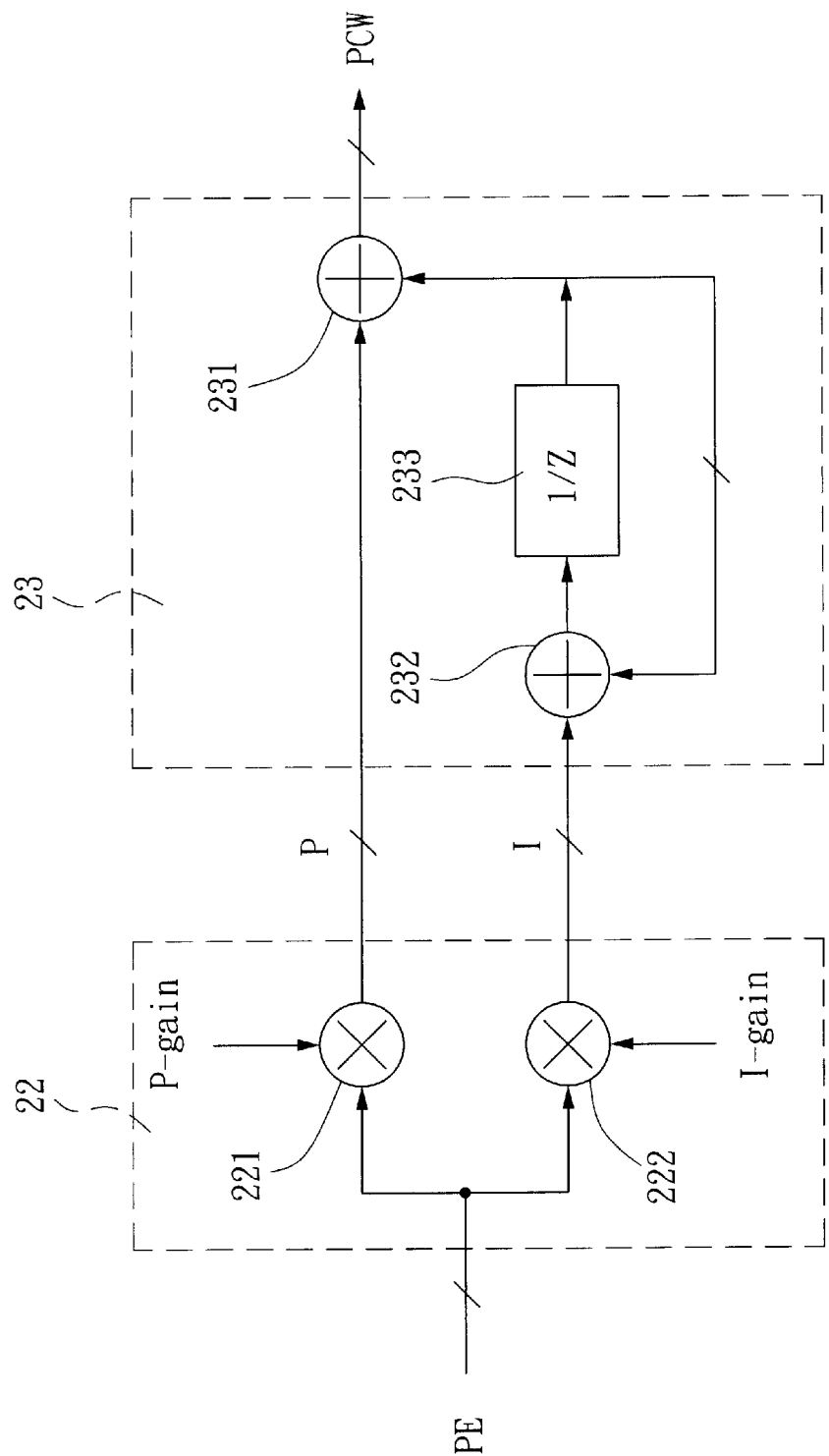
FIG. 4 is a circuit diagram comprising a digit pump and a digital filter in FIG. 2.

FIG. 4 is a circuit diagram comprising a digit pump 22 and a digital filter 23. The digit pump 22 receives the phase-difference signal PE and outputs a proportional output signal P and an accumulative output signal I. The digital filter 23 receives the proportional output signal P and the accumulative output signal I so as to generate a control signal PCW. The digit pump 22 comprises two multipliers 221 and 222. The multiplier 221 multiplies the phase-difference signal PE by a proportional gain value (P-gain) so as to generate a proportional output signal P. On the other hand, the multiplier 222 multiplies the phase-difference signal PE by an accumulative gain value (I-gain) so as to generate an accumulative output signal I. The accumulative output signal I is input into an adder 232 and an integrator 233 for integration and is then added to with the proportional output signal P by an adder 231 so as to generate the control signal PCW. As shown in FIG. 4, the adder 231 is equivalent to the resistor $R_S$ in a conventional analog loop filter, while the adder 232 together with the integrator 233 is equivalent to the capacitor $C_S$ in a conventional analog loop filter.

The digit-controlled oscillator 24 receives the control signal PCW and generates a phase-select signal PS. The digit-controlled oscillator 24 can be implemented by using an accumulator and the mean-frequency signal $F_{av}$ as a triggering clock pulse. The control signal PCW is accumulated so as to output a carry signal functioning as a phase-select signal PS. Therefore, the larger the value of the control signal PCW is, the higher the probability that the phase-select signal PS appears would be. The relation between the frequency $f_{av}$ of the mean-frequency signal $F_{av}$, the control signal PCW and the frequency $f_{ps}$ of the phase-select signal PS is described in Equation (2):

$$f_{ps} = f_{av} \cdot \frac{PCW}{2^n} \quad (2)$$

where $2^n$ indicates the maximum value of the digit-controlled oscillator 24, equivalent to an n-bit accumulator.

The multi-phase frequency generator 26 provides a plurality of multi-phase signals PH1~PHn. The frequency of these signals PH1~PHn is close to the frequency $f_{av}$ of the mean-frequency signal $F_{av}$. The multi-phase frequency generator 26 has been disclosed in the prior art, and thus the description thereof is omitted. The phase selector 25 receives the multi-phase signals PH1~PHn and selects among different phase signals according to the phase-select signal PS. In other words, the phase selector 25 selects a neighboring (preceding or successive) phase according to the frequency of the multi-phase signals PH1~PHn and the frequency $f_{av}$ of the mean-frequency signal $F_{av}$ once the phase-select signal PS is triggered. Therefore, when the system is at a steady state, the control signal PCW is fixed at a constant value such that the frequency of the phase-select signal PS allows the frequency of the mean-frequency signal $F_{av}$ output from the phase selector 25 in an acceptable range.

Certainly, the frequency range of the mean-frequency signal $F_{av}$ is limited by the frequency as well as the number n of the multi-phase signals PH1~PHn generated by the multi-phase frequency generator 26. For example, if the frequency of the multi-phase signals PH1~PHn is 35 MHz and the number n of the multi-phase signals is 16, the frequency range for the mean-frequency signal $F_{av}$ is $F_{max}$~$F_{min}$, where $$F_{max} = 35 \text{ MHz} \cdot \frac{17}{16} = 37.1875 \text{ MHz}$$

$$F_{min} = 35 \text{ MHz} \cdot \frac{15}{16} = 32.8125 \text{ MHz}$$

The analog phase-locked loop 27 is a general PLL for filtering out the cycle-to-cycle jitter of the mean-frequency signal $F_{av}$. Since the frequency of the mean-frequency signal $F_{av}$ is much higher than that of the reference signal $F_{ref}$, the bandwidth of the analog phase-locked loop 27 can be designed to be wider so as to suppress the long-term jitter of the voltage-controlled oscillator in the analog phase-locked loop 27, reducing the jitter of the output signal $F_{VCO}$. Furthermore, the proportional gain value (P-gain) and the accumulative gain value (I-gain) can be adjusted smaller so as to filter out the jitter of the reference signal $F_{ref}$ by making the bandwidth of the loop narrower. The frequency divider 28 divides the output signal $F_{VCO}$ by a multiple and then outputs an oscillation feedback signal $F_b$. Accordingly, the PLL controls the frequency of the output signal $F_{VCO}$ by controlling the multiple.

Moreover, the present invention further provides a method for controlling a hybrid phase-locked loop. The method comprises steps of.

Step 1: detecting a phase frequency, wherein the phase difference between a reference signal and an oscillation feedback signal is detected so as to generate a digital phase-difference signal according to a mean-frequency signal.

Step 2: calculating gain signals, wherein the phase-difference signal is received and digital processing is used so as to calculate a proportional gain signal and an accumulative gain signal according to a proportional gain value and an accumulative gain value.

Step 3: calculating a control signal, wherein digital processing is used so as to calculate a digital control signal according to the proportional gain signal and the accumulative gain signal.

Step 4: digital oscillation, using a digit-controlled approach so as to generate a phase-swap signal according to the control signal and the mean-frequency signal, wherein the digit-controlled approach accumulates the control signal so as to output a carry signal to be the phase-swap signal.

Step 5: phase selecting, wherein a plurality of multi-phase signals and the phase-swap signal are received so as to select one among neighboring phases to be the mean-frequency signal according to the phase-swap signal.

Step 6: filtering out the jitter, wherein an analog phase-locked loop is used for filtering out the cycle-to-cycle jitter of the mean-frequency signal so as to generate an output signal.

Step 7: frequency dividing, wherein the output signal is received and the frequency thereof is divided so as to generate the oscillation feedback signal.

According to the above discussion, the present invention discloses a hybrid phase-locked loop with digital processing and analog processing mixed therein. Therefore, the present invention has been examined to be novel, unobvious and useful.

Although this invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. A phase-locked loop, comprising:
   a phase detector detecting the phase difference between a reference signal and an oscillation feedback signal and generating a digital phase-difference signal according to a mean-frequency signal;
   a digit pump receiving said digital phase-difference signal and generating a proportional gain signal and an accumulative gain signal according to a proportional gain value and an accumulative gain value;
   a digital filter receiving said proportional gain signal and said accumulative gain signal so as to generate a digital control signal;
   a digital-controlled oscillator (DCO), for receiving said digital control signal and said mean-frequency signal so as to generate a phase-swap signal;
   a phase selector receiving a plurality of multi-phase signals and said phase-swap signal so as to select one among neighboring phases to be said mean-frequency signal according to said phase-swap signal; and
   a frequency divider receiving said mean-frequency signal and dividing the frequency thereof so as to generate said oscillation feedback signal.

2. The phase-locked loop as recited in claim 1, further comprising a multi-phase frequency generator for generating said multi-phase signals.

3. The phase-locked loop as recited in claim 1, wherein said mean-frequency signal functions as a reference clock pulse for said digit pump.

4. The phase-locked loop as recited in claim 1, wherein said mean-frequency signal functions as a reference clock pulse for said digital filter.

5. The phase-locked loop as recited in claim 1, wherein said mean-frequency signal is controlled by controlling a multiple in said frequency divider.

6. The phase-locked loop as recited in claim 1, wherein said digital-controlled oscillator is an accumulator.

7. The phase-locked loop as recited in claim 1, further comprising:
   an analog phase-locked loop filtering out a cycle-to-cycle jitter of said mean-frequency signal.

8. The phase-locked loop as recited in claim 7, further comprising:
   a multi-phase frequency generator for generating said multi-phase signals.

9. The phase-locked loop as recited in claim 7, wherein said digital-controlled oscillator is an accumulator.

10. The phase-locked loop as recited in claim 7, wherein said mean-frequency signal is controlled by controlling a multiple in said frequency divider.

11. A method for controlling a hybrid phase-locked loop, comprising steps of:
    detecting a phase difference between a reference signal and an oscillation feedback signal to generate a digital phase-difference signal according to a mean-frequency signal;
    generating a proportional gain signal and an accumulative gain signal according to a proportional gain value and an accumulative gain value and said digital phase-difference signal;
    generating a digital control signal according to said proportional gain signal and said accumulative gain signal;
    generating a phase-swap signal according to said control signal and said mean-frequency signal;
    selecting one among neighboring phases of multi-phase signals to be said mean-frequency signal according to said phase-swap signal and said mean-frequency signal is an output signal; and
    dividing the frequency of said mean-frequency signal to generate said oscillation feedback signal.

12. The method as recited in claim 11, further comprising:
    generating said multi-phase signals using a multi-phase frequency generator.

13. The method as recited in claim 11, wherein said mean-frequency signal is used as a reference clock pulse for said step of generating gain signals.

14. The method as recited in claim 11, wherein said mean-frequency signal is used as a reference clock pulse for said step of generating a digital control signal.

15. The method as recited in claim 11, wherein said mean-frequency signal is controlled by controlling a multiple in said step of dividing the frequency.

16. The method as recited in claim 11, further comprising:
    filtering out a cycle-to-cycle jitter of said mean-frequency signal using an analog phase-locked loop.

17. The method as recited in claim 16, further comprising:
    generating said multi-phase signals using a multi-phase frequency generator.

18. The method as recited in claim 16, wherein said mean-frequency signal is used as a reference clock pulse for said step of generating gain signals.

19. The method as recited in claim 16, wherein said mean-frequency signal is used as a reference clock pulse for said step of generating a digital control signal.

20. The method as recited in claim 16, wherein said mean-frequency signal is controlled by controlling a multiple in said step of dividing the frequency.

* * * * *